(12) United States Patent
Clement et al.

(10) Patent No.: US 7,969,339 B2
(45) Date of Patent: Jun. 28, 2011

(54) ELECTRONIC DEVICE AND INTEGRATED CIRCUIT COMPRISING A DELTA-SIGMA CONVERTER AND METHOD THEREFOR

(75) Inventors: Patrick Clement, Bussigny (CH); Maher Kayal, St. Sulpice (CH); Sergio Pesenti, Vevey (CH)

(73) Assignee: Freescale Semiconductor, Inc., Austin, TX (US)

( * ) Notice: Subject to any disclaimer, the term of this patent is extended or adjusted under 35 U.S.C. 154(b) by 248 days.

(21) Appl. No.: 12/293,744

(22) PCT Filed: Mar. 23, 2006

(86) PCT No.: PCT/EP2006/060979
§ 371 (c)(1),
(2), (4) Date: Sep. 19, 2008

(87) PCT Pub. No.: WO2007/107188
PCT Pub. Date: Sep. 27, 2007

(65) Prior Publication Data
US 2010/0164773 A1 Jul. 1, 2010

(51) Int. Cl.
*H03M 3/00* (2006.01)
(52) U.S. Cl. ........................................ 341/143; 341/155
(58) Field of Classification Search ................... 341/143, 341/155, 144, 120, 118
See application file for complete search history.

(56) References Cited

U.S. PATENT DOCUMENTS

| | | | |
|---|---|---|---|
| 5,329,281 A * | 7/1994 | Baumgartner et al. | 341/139 |
| 6,743,164 B2 * | 6/2004 | Airaudi et al. | 600/27 |

FOREIGN PATENT DOCUMENTS

| | | |
|---|---|---|
| DE | 102004030812 A1 | 9/2005 |
| EP | 1480342 A2 | 11/2004 |

OTHER PUBLICATIONS

Lu; "A novel signal-predicting multibit delta-sigma modulator" Proceedings of the 2004 11th IEEE International Conference on Electronics, Circuits and Systems, 2004. ICECS 2004. Dec. 13-15, 2004 pp. 105-108.
Grilo et al; "A 12mW ADC Delta-Sigma Modulator with 80dB of Dynamic range Integrated in a single-chip Bluetooth Transceiver"; IEEE JSSC, vol. 37, No. 3.
Petrie et al; "Multi-bit Sigma-Delta ADC"; Motorola Data Converter Conference, Jul. 2001.

* cited by examiner

*Primary Examiner* — Peguy JeanPierre

(57) ABSTRACT

An integrated circuit comprises a delta-sigma modulator incorporating a delta-sigma modulation loop having an analog-to-digital converter in a forward path and a digital-to-analog converter in a feedback path such that the ADC is arranged to receive samples of an analog input signal. The ADC is operably coupled to auto-ranging logic arranged to shift a digital output signal from the ADC representative of the analog input signal to counteract an effect of an input variation of the analog input signal. In this manner, the application of auto-ranging logic with a self-recovery technique supports a reduction of the number of comparators required in a multi-bit delta-sigma ADC.

20 Claims, 4 Drawing Sheets

US 7,969,339 B2

ELECTRONIC DEVICE AND INTEGRATED CIRCUIT COMPRISING A DELTA-SIGMA CONVERTER AND METHOD THEREFOR

FIELD OF THE INVENTION

Embodiments of the present invention relate to an electronic device, such as a wireless communication unit, comprising a delta-sigma analog-to-digital converter. The invention is applicable to, but not limited to, an electronic device comprising a multi-bit delta-sigma analog-to-digital converter.

BACKGROUND OF THE INVENTION

With the increasing demand for electronic devices to have reduced current consumption, and to avoid the use of off-chip components, there has been an increasing trend for electronic devices to perform processing in the digital domain. Consequently, there has been an increasing demand for high-resolution, low-power, and inexpensive analog-to-digital converters (ADC).

One type of ADC that is commonly used for analog-to-digital conversion of signals is the over sampling ADC based upon delta-sigma $\Delta\text{-}\Sigma$ modulation. Over sampling ADCs use an over sampling ratio (OSR) that is the ratio of the sampling frequency of the delta-sigma modulator up to twice the bandwidth (Nyquist frequency) of the input signal. The over sampling ratio (OSR) is typically greater than one and will often be greater than a few tens. For conventional n-th order delta-sigma modulators (DSM), the signal to quantization noise ratio increases by n*6 dB+3 dB for each doubling of the OSR. Thus, better resolution is achieved by implementing a higher OSR.

Furthermore, multi-order modulators are arranged to provide noise shaping, such that the quantization noise is small in the frequency band of interest, and large elsewhere. For applications that operate with a low bandwidth, for example 20 kHz, a simple DSM, for example a $2^{nd}$ order DSM, would be suitable for providing the required noise shaping.

However, more recently there has been a need to use ADCs in high bandwidth applications, such as cellular systems and wireless local area networks (WLAN). For example, a wireless wideband code division multiple access (WCDMA) handset may be required to operate with a bandwidth of the order of 2 MHz. For a low order DSM to provide the required analog to digital conversion for a high bandwidth signal, with the required noise shaping, a high OSR would be required that would not only be difficult to design but would also result in a high power consumption for the DSM.

Such a requirement is unacceptable for battery-powered applications or products, such as mobile phones. It is possible for a DSM to provide the required noise shaping characteristics for high bandwidth applications, with a reduced OSR, by increasing the order of the DSM. However, for the DSM to have the dynamic range required for high bandwidth applications it is desirable for the DSM to include, or at least to be combined with, an embedded parallel (i.e. flash) ADC having a 2-bit or greater number of bits quantizer. However, the use of a high bit flash ADC again results in high power consumption. For example, the power dissipation for a 6-bit quantizer may correspond to approximately a quarter of the total DSM power dissipation.

In the field of the present invention, the document 'Multi-bit Delta-sigma ADC', authored by C. Petrie and M. Miller, Motorola Data Converter Conference, July 2001: describes a 2nd order 6-bit DSM.

European Patent Application EP1800342 describes a mechanism for dynamic control of a number of active bits in a multi-bit quantizer. EP1800342 describes a windowing technique to turn off unnecessary comparators in the quantizer. By turning off some comparators the power dissipation is reduced but the die size remains unchanged. Furthermore, the technique is impractical with a low voltage supply, as are used by wireless communication units.

Thus, a need exists for an improved electronic device, and an integrated circuit (IC), comprising a multi-bit delta-sigma converter and method of operation therefor that minimizes power dissipation, die size and voltage supply requirements. It is also desirable to improve the stability of such a delta-sigma converter in a presence of large 'out-of-band' interfering signals.

SUMMARY OF THE INVENTION

In accordance with aspects of the present invention, there is provided an electronic device, such as a wireless communication unit, an integrated circuit comprising a delta-sigma modulator, and a method of operation therefor, as defined in the appended Claims.

DESCRIPTION OF EMBODIMENTS OF THE INVENTION

Figure 1:
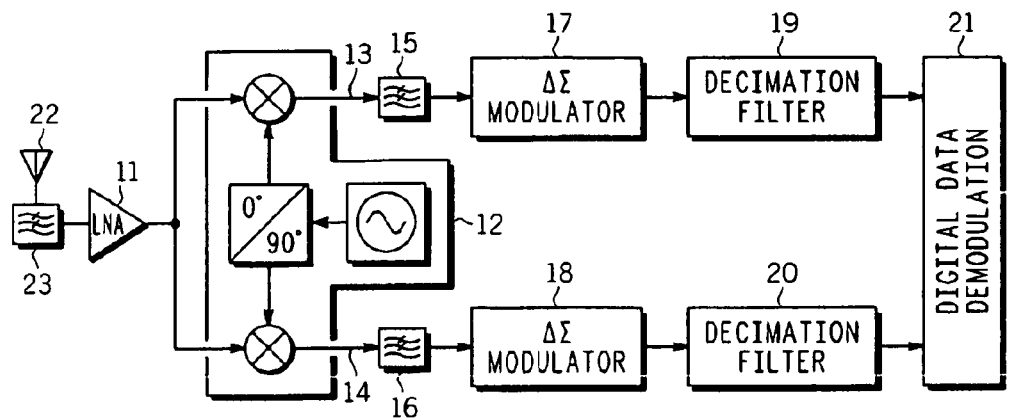
FIG. 1 illustrates a wireless receiver incorporating a delta-sigma modulator adapted according to embodiments of the present invention.

In one embodiment of the present invention, an integrated circuit comprises a delta-sigma modulator incorporating a delta-sigma modulation loop having an analog-to-digital converter (ADC) in a forward path and a digital-to-analog converter (DAC) in a feedback path, such that the ADC is arranged to receive samples of an analog input signal. The ADC is operably coupled to auto-ranging logic arranged to shift a digital output signal from the ADC representative of the analog input signal to counteract an effect of an input variation of the analog input signal.

Such an embodiment may, by provision of auto-ranging logic arranged to shift a digital output signal from the ADC to counteract an effect of an input variation of the analog input signal, support a reduction in power consumption and die size of a delta-sigma modulator.

In one embodiment of the present invention, the auto-ranging logic is arranged to dynamically shift an output digital signal level of the ADC, which when applied to the ADC via the feedback path and the DAC correspondingly shifts the analog input signal to the ADC.

Thus, such a feedback embodiment enables dynamic adjustment of the analog input signal to track a corresponding adjustment of the digital output signal. This may provide an improvement to the delta-sigma modulator and/or a reduction in power consumption and die size of the delta-sigma modulator.

In one embodiment of the present invention, the auto-ranging logic is arranged to shift the analog input signal and/or digital output signal to a mid-range of operation of the ADC.

Thus, such an embodiment enables the ADC to operate in its mid-range region, thereby avoiding the ADC operating in a failure range or a range outside of an optimum range. This may provide an improvement to the delta-sigma modulator and/or a reduction in power consumption and die size of the delta-sigma modulator.

In one embodiment of the present invention, the auto-ranging logic comprises decision logic arranged to determine a variation of the analog input signal to the ADC and perform a corresponding shift of the analog signal input to the ADC via the feedback path to counteract an effect of the variation.

The decision logic may be operably coupled to a digital integrator and be arranged to determine a shift in the digital output signal from the ADC corresponding to the variation of the analog input signal and provide a pulse signal to the digital integrator in response thereto. The integrated pulse signal output from the digital integrator may be combined with the analog signal input to the ADC, and integrated by an analog integrator, to shift the analog signal input to the ADC.

In one embodiment of the present invention, the decision logic determines a variation of the digital output signal from the ADC from a mid-range position of the ADC.

In one embodiment of the present invention, the auto ranging logic is operably coupled to a reset circuit arranged to reset one or more components in the delta-sigma modulator in response to determining that the analog input signal has traversed outside of a threshold.

In one embodiment of the present invention, the delta-sigma modulator comprises a plurality of analog integrators in the forward path of the delta-sigma modulation loop wherein at least one integrator of the plurality of analog integrators is reset in response to determining that the analog input signal has traversed outside of an upper threshold or a lower threshold.

Thus, in this manner, the application of auto-ranging logic with a self-recovery technique may support a reduction of the number of comparators required in a multi-bit quantizer of a $2^{nd}$ order delta-sigma ADC.

In one embodiment of the present invention, the reset recovery circuit may detect whether one or more of the following events has/have occurred in the ADC:
  (i) The digital output signal travels between a first (high) threshold level and a second (low) threshold level within one or two clock-cycles; or
  (ii) The digital output signal remains at either a threshold level for at least four clock-cycles.

Thus, in this manner, the reset recovery circuit provides a self-recovery technique that may support a reduction of the number of comparators required, for example in a multi-bit quantizer of a $2^{nd}$ order delta-sigma ADC.

In one embodiment of the present invention, a method for converting an analog signal to a digital signal in a delta-sigma modulator, incorporating a delta-sigma modulation loop and an analog to digital converter, is described. The method comprises periodically sampling an analog signal with a plurality of comparators; and converting the sampled analog signal to a digital output signal representative of the analog input signal. The method further comprises determining a variation in the analog input signal; and shifting the digital output signal from the ADC to counteract an effect the determined variation of the analog input signal.

In one embodiment of the present invention, a wireless communication unit is provided that comprises the aforementioned integrated circuit.

In one embodiment of the present invention, a wireless communication unit is provided that comprises a delta sigma modulator adapted to perform the aforementioned method.

In summary, although embodiments of the present invention are described with reference to a wireless communication unit, it is envisaged that the inventive concept is applicable to any electronic device comprising a multi-bit delta-sigma modulator.

Referring now to FIG. 1, a simplified arrangement of a wireless receiver 10 is illustrated. The wireless receiver is applicable for use in any wireless communication unit, such as a mobile/portable phone, mobile/portable radio or any WLAN unit.

The receiver 10 includes an antenna 22 for receiving radio frequency signals. The antenna 22 is operably coupled to a band-pass filter 23 for filtering received signals outside of a desired radio frequency band. The band-pass filter 23 is operably coupled to a low-noise amplification (LNA) section 11 coupled to a quadrature down-conversion section 12. The quadrature down conversion section 12 includes in-phase and quadrature baseband signal outputs 13, 14 that are coupled to respective anti-aliasing filters 15, 16. The outputs of the respective anti-aliasing filter 15, 16 are coupled to respective multi-bit delta-sigma modulators 17, 18. The respective delta-sigma modulator outputs are coupled to respective decimator filters 19, 20, where the outputs of the respective decimator filter 19, 20 are coupled to a digital data modulator section 21.

Figure 2:
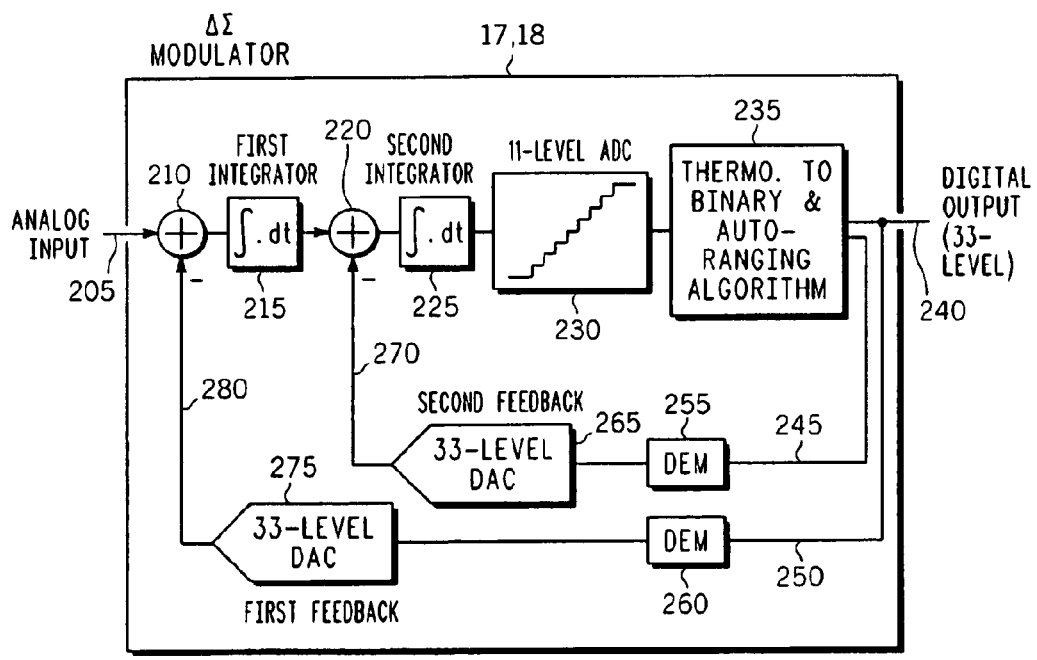
FIG. 2 illustrates a delta-sigma modulator adapted according to embodiments of the present invention.

Referring now to FIG. 2, a delta-sigma modulator 17, 18 adapted according to embodiments of the present invention is illustrated. The delta-sigma modulator 17, 18 has an analog input 205 applied to a positive input of a first summing node 210. A negative input of the first summing node 210 is provided by a first feedback path 280. The output of the first summing node 210 is input to a first integrator 215, which integrates the summed analog input signal. The output from the first integrator 215 is input to a second summing node 220. A negative input of the second summing node 220 is provided by a second feedback path 270. The output of the second summing node 220 is input to a second integrator 225, which outputs a further integrated signal to an 11-level analog-to-digital converter (ADC) 230. The 11-level ADC 230 converts the analog signal to a digital signal that is input to a thermo-to-binary and auto-ranging logic 235. The output 240 of the thermo-to-binary and auto-ranging algorithm 235 is effectively an output of the delta-sigma modulator 17, 18.

The output 240 of the thermo-to-binary and auto-ranging algorithm 235 also provides two feedback paths 245, 250, to negative inputs of the first summing node 210 and second summing node 220 via respective dynamic element matching (DEM) encoders 255, 260. The DEM encoders are also known as mismatch shaping encoders. This is in contrast to known DEM systems used in multi-bit modulators, where typically only one DEM encoder is used for both feedback paths 245, 250, because the signal they are feeding back to summing nodes is the same. The two feedback paths 245, 250 further comprise respective 33-level digital-to-analog converters (DACs) 265, 275.

Notably, in embodiments of the present invention, two DEMs are used, since the second feedback path 245 is affected by a pulse signal that is not provided in the first feedback path. The pulse signal provides an analog shift at the ADC input, as described further with respect to FIG. 3 and FIG. 4.

In embodiments of the present invention, the respective comparator outputs of the 11-level ADC 230 (i.e. a total of 10 lines) are coupled to the auto-ranging logic 235 (via comparators (not shown)) where the auto-ranging logic 235 converts the '10' digital input lines into a representative 33-level digital signal.

Thus, it is envisaged that auto-ranging logic 235 comprises any circuit, device and/or combination of logic elements that are arranged to identify a change in the analog input signal to the ADC 230 (or a corresponding variation in the digital output signal from the ADC 230) and implement a shift in the digital output signal in response thereto. Hence, auto-ranging logic 235, may comprise any circuit, device and/or combination of logic elements that is able to modify a digital stream that represents the digital output signal from the ADC, or any other form of digital signal representative of the determined variation in the analog input signal.

The 33-level digital output 240, in one embodiment coded with binary code of 5 bits plus an extra least significant bit (LSB) of the auto-ranging logic 235, is connected to both a control circuit (not shown, but which forms part of the auto-ranging logic 235), and the decimation filter 19, 20 of FIG. 1.

In summary, the output of the 10-comparators in the 11-level ADC 230, acting as an 11-level quantizer, is used to predict the next sample to be quantized. A quantizing window applied by the 11-level ADC 230 is adapted accordingly, as described later with respect to FIG. 5, through the feedback path through the DAC and the second (i.e. last) integration stage of the delta-sigma modulator 17, 18.

Figure 7:
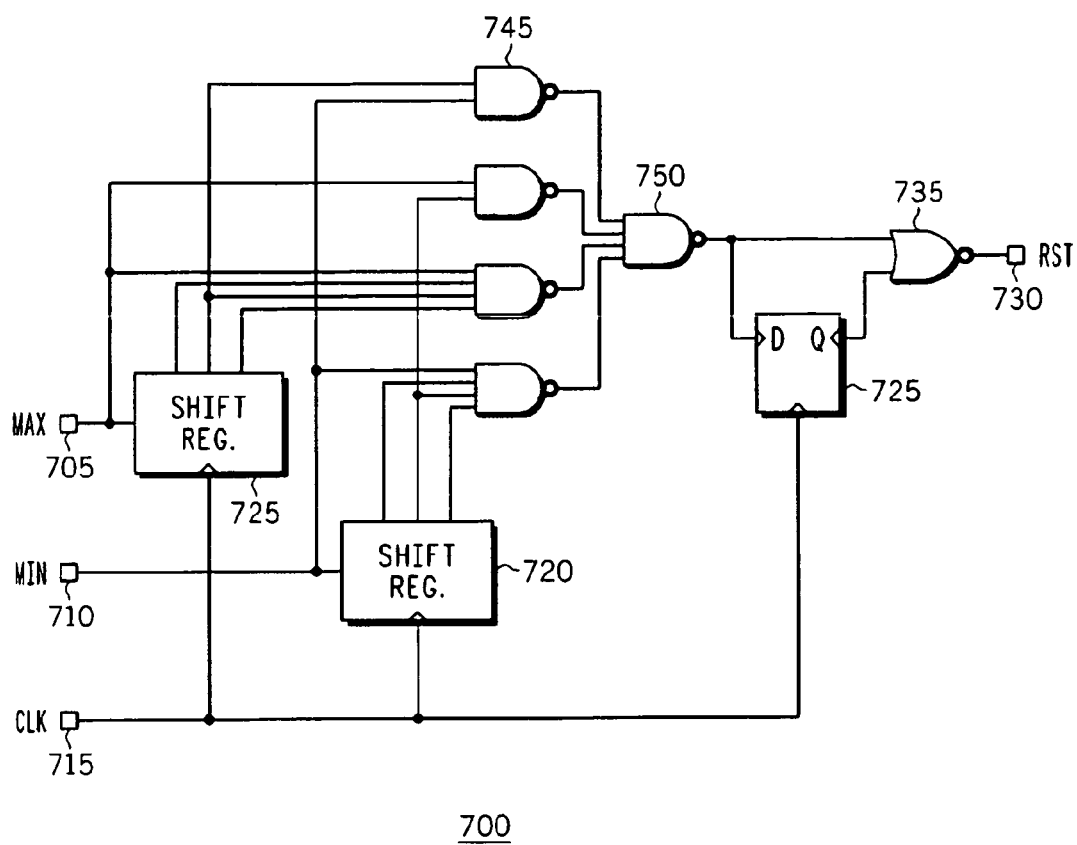
FIG. 7 illustrates an additional circuit to provide reset recovery, in accordance with embodiments of the present invention.

At the same time, according to some embodiments of the present invention, unstable conditions are detected and a reset signal is generated. The reset signal that is generated, as described with respect to FIG. 7, is applied repeatedly to the first integrator 215 and second integrator 225 and the digital integrator 320 until the delta-sigma modulator 17, 18 reaches stable conditions.

In a conventional low-pass modulator, the flash ADC output is the result of the addition of two signals: a first signal with rapid changes over few quantization steps and a second signal with slow changes over many quantization steps. However, in embodiments of the present invention, and advantageously, the number of comparators used in the ADC is reduced, whilst ensuring stable working conditions.

In effect, the shifting mechanism described later with respect to FIG. 4 facilitates the emulation of a wider-range ADC. For example, all the input signal variations need to be sensed by the emulated 33-level ADC. The few levels that vary rapidly of the ADC input signal are random, and therefore unpredictable for each sample taken. As the samples of the rapidly varying ADC input signal are unpredictable, a minimum number of levels need to be available at each time step to make sure that they are quantized.

In contrast, for the majority of input signals that traverse over many levels in a slow varying manner, many samples are taken. As a consequence the emulated 33-level ADC output has a tendency to be more predictable. In accordance with embodiments of the present invention, the more predictable ADC output signals can be tracked through a level-shifting mechanism, as described later with respect to FIG. 5. Here, the digital output signal in a form of a digital bit stream (or any other form of digital signal representative of the determined variation in the analog input signal), which represents the digital output signal from the ADC, may be adapted (shifted) to counteract an effect of the variation in analog input signal. Thus, the bit stream values output from the ADC 230 may be adapted to reflect a desired digital signal to be fed back to the ADC input via the feedback path and a DAC.

Thus, and advantageously, a wider-range ADC may be emulated by tracking the slow-varying part of the ADC input signal.

Figure 3:
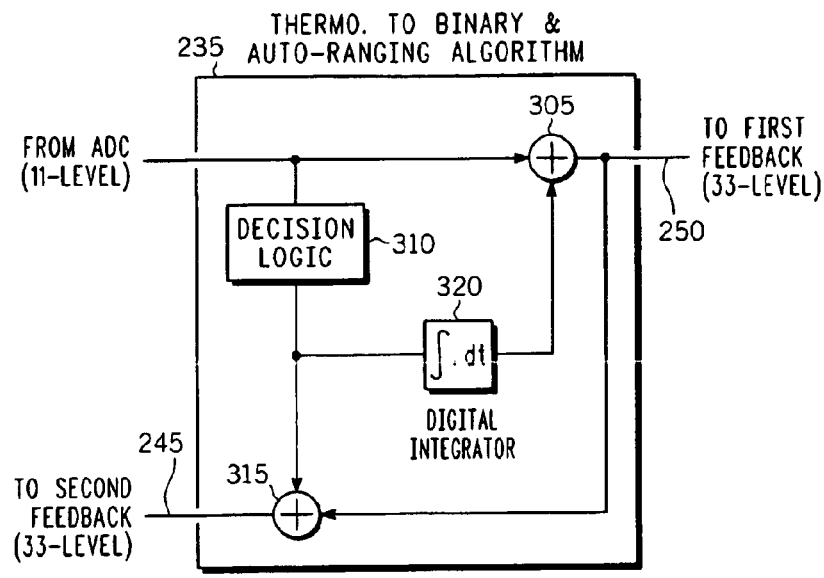
FIG. 3 illustrates an auto-ranging logic unit according to embodiments of the present invention.

Referring now to FIG. 3, auto-ranging logic 235 employing embodiments of the present invention is illustrated in greater detail. The output of the 11-level ADC (say ADC 230 of FIG. 2) is input to a summing junction 305, the output of which is applied as the first feedback path 250, as well as the digital output of the delta-sigma modulator. The output of the 11-level ADC is also input into a decision logic 310, which is further described with respect to FIG. 5 and FIG. 6.

A pulse signal output from the decision logic 310 is input to an internal digital integrator 320, which integrates the pulse signal output from the decision logic 310 and applies the integrated pulse signal to the summing junction 305. Once integrated by the second integrator 225 of FIG. 2, the pulse signal turns into an analog shift signal to be applied at the ADC input. This results in an identical digital shift at the ADC output. Thus, a pulse signal is applied to both the second (last) analog integrator 225, via feedback path 245, and the internal digital integrator 320.

In one embodiment, it is envisaged that the analog shift may be performed by an auxiliary circuit. However, in one embodiment of the present invention it is proposed to advantageously 're-use' the last integration path (e.g. the DAC 265 and the analog integrator 225). This implies, in one embodiment, of using two different digital encoders. Thus, in this manner, the complexity and size of the analog circuitry is reduced (e.g. less comparators are used). In submicron CMOS technology, transferring a task from the analog to digital domain is extremely effective, both in terms of die area and power consumption.

In one embodiment of the present invention, the auto-ranging logic 235 includes a self-recovery technique, as illustrated with respect to FIG. 7. The self-recovery technique described in FIG. 7 facilitates a reduction in the number of comparators that are required in the 11-level Flash quantizer 108.

Figure 4:
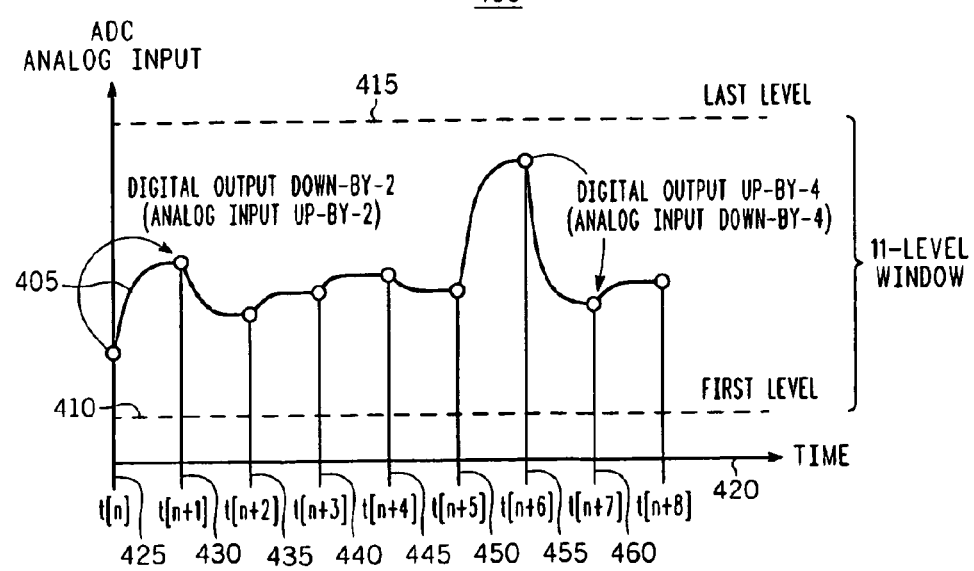
FIG. 4 illustrates the auto-ranging operation principle of FIG. 3 in accordance with embodiments of the present invention.

FIG. 4 illustrates a graph of an ADC input signal 405, highlighting a first (high) threshold voltage level 415 and a second (low) threshold voltage level 410 of the 11-level ADC window, versus time 420. The ADC input signal is shown as being sampled at times t[n] 425, t[n+1] 430, t[n+2] 435, t[n+3] 440, t[n+4] 445, t[n+5] 450, t[n+6] 455, t[n+7] 460, etc. . . . As illustrated in FIG. 4, the ADC input signal sampled at t[n+1] 430, shows that the auto-ranging algorithm has increased the ADC input signal by a value of '2' to re-centre the signal with respect to the 11-level window. Consequently, the algorithm, as described with reference to FIGS. 1 to 3, imparts a decrease in the digital output of '2'.

Similarly, the ADC input signal sampled at t[n+7] 460, shows that the auto-ranging algorithm has decreased the ADC input signal by a value of '4' to re-centre the signal with respect to the 11-level window. Consequently, the algorithm, as described with reference to FIGS. 1 to 3 imparts an increase in the digital output of '4'.

Thus, as the ADC analog input moves away from the centre of the 11-level window, the voltage level of the analog signal is adjusted (auto-ranged) by an amount sufficient to bring the analog signal to a voltage level substantially closer to the centre of the 11-level window. In the above cases, the voltage level of the analog signal is adjusted by '2' and '4' respectively in the next sample period. Thus, the auto-ranging logic is arranged to shift an output signal from the ADC (230) to a mid-range between an upper threshold voltage level (415) and a lower threshold voltage level (410) to counteract an effect of an input variation of the analog input signal. The provision of a feedback path provides a corresponding adjustment in the analog input signal. The sampling operation then continues, as shown.

In this manner, the ADC input signal is sampled at each sampling point and, as the analog input signal varies, the 'window' is adjusted by a comparable amount. In the context of the present invention, the term 'window' is used to encompass the collection of the 11-levels of the ADC. Therefore, the auto-ranging logic 235 is able to maintain the ADC input signal within the reduced quantizing window for the 11-level flash ADC input 200.

A skilled artisan will appreciate that when the real ADC input signal is down-shifted, the 11-level digital output down-shifts too. Thus, a digital up-shift compensates for any real down-shift, in order to keep the information unchanged. Furthermore, it is noteworthy that a signal shift does not change the signal passing through the emulated ADC, but is in fact a result of the process of emulating the 33-level output.

Figure 5:
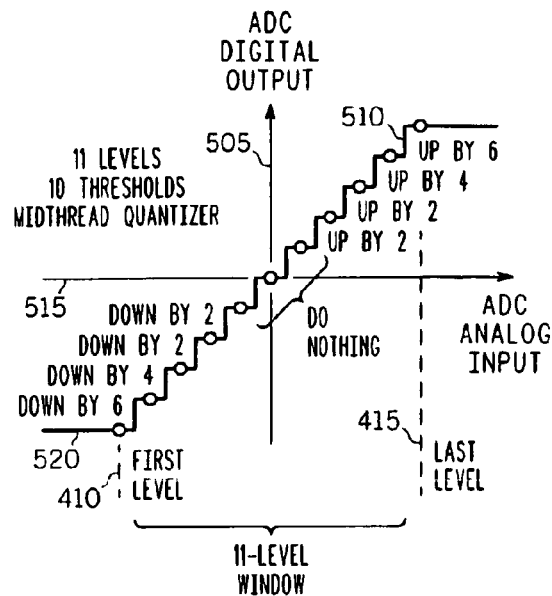
FIG. 5 illustrates a decision scheme of the auto-ranging principle of FIG. 4 in accordance with embodiments of the present invention.

When considering the graph 400 of an ADC input signal 405 together with graph 500 of FIG. 5, it is noteworthy that if the lowest (second) level 410 is reached, an up-by-6 is performed. In contrast, if the first (high) level (415) is reached, a down-by-6 is performed. Additionally, the decision logic (310) is implemented in a manner such that when the emulated ADC output approaches either edge of the 33-level window it progressively stops shifting.

Now, and with reference to FIG. 5, the corresponding digital adjustment of the output signal is illustrated in the graph 500 of FIG. 5. The digital auto-ranging is based on a variation in the analog input signal. Thus, as the analog input signal 515 increases above a mid-range threshold, the ADC digital output signal 505 is correspondingly adjusted (auto-ranged) upwards, as shown in the step-up operations 510. A skilled person will appreciate that this digital representation of an amplitude shift may, in practice, be represented as changes to 'bit' values in a digital bit stream. Similarly, as the analog input signal 515 decreases below a mid-range threshold, the ADC digital output signal 505 is corresponding adjusted (auto-ranged) downwards, as shown in the step-down operations 520.

Figure 6:
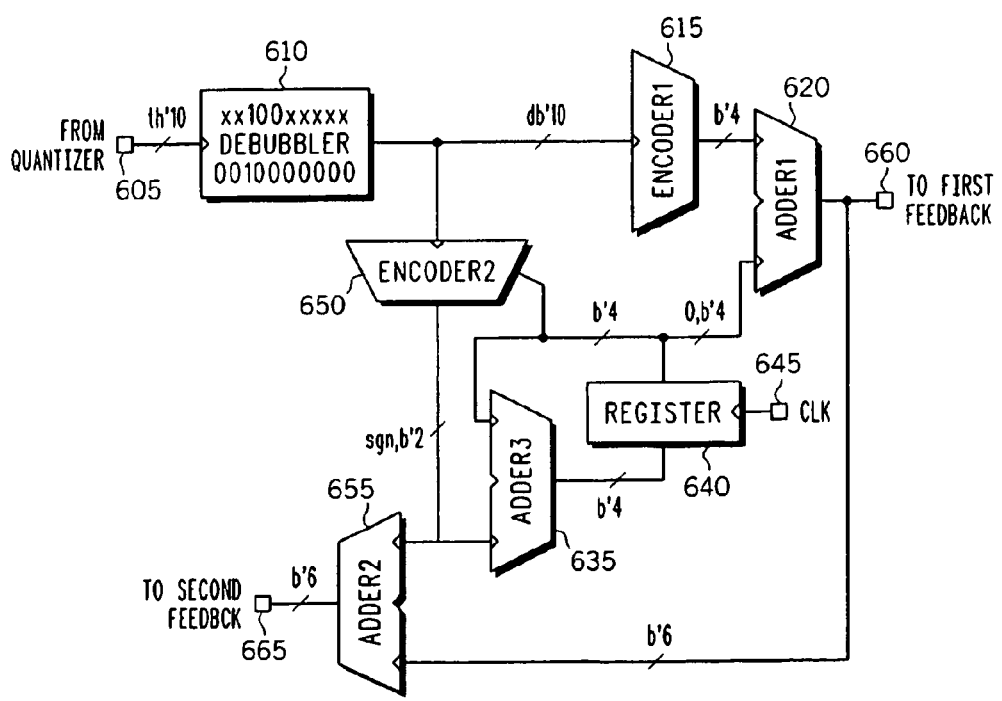
FIG. 6 illustrates a hardware implementation of auto-ranging logic arranged to perform a window calculation, in accordance with embodiments of the present invention.

Referring now to FIG. 6, one example of a hardware implementation 600 of the auto-ranging logic 235, arranged to perform and implement the window calculation, is illustrated, in accordance with embodiments of the present invention. In this example, the 10 lines of the 11-level ADC signal 605 are input to a debubbler 610. The debubbler 610 is a conventional component often located after a flash ADC.

The debubbler 610 converts a thermometer code (for example of the form: '1111111000000000') into a code that is made up of zeros, except where a transition occurs (for example of the form: '0000001000000000'). At the same time, the debubbler 610 removes eventual bubbles (for example of the form: '1101111000000000').

To clarify the term 'thermometer code' as indicated above, let us consider the 11-level ADC 230, which is made up of 10 comparators, each having a different reference voltage. Imagine, for a given input, that comparator-3 provides a logic '1' and comparator-4 provides a logic '0'. In such a case, every comparator above comparator-4 provides a logic '0' and every comparator below comparator-3 provides a logic '1'. Thus, the output from the 10 comparators is '111 0000000', thereby theoretically appearing like a thermometer. Thus, the debubbler removes the eventual bubbles and provides '0010000000', which makes the encoder easier to implement, as known to those skilled in the art.

The converted code is applied to two encoders 615, 650, although it is envisaged that the inventive concept may be applied to multiple encoders. A first encoder 615 simply converts the debubbler output into a 4-bit binary code that is input to adder logic 620.

A second encoder 650 is arranged to receive the debubbler output and implement the auto-ranging decision logic scheme described in FIG. 5. In this regard, the second encoder 650 applies an adjustment to second adder logic 655 and third adder logic 635. The second encoder 650 is clocked by register 640, which is operably coupled to a clock input 645. The output from the third adder 635 is input to the register 640. In effect, the digital integrator 320 of FIG. 3 comprises third adder 635 and register 640.

A 6-bit signal is output 660 from the first adder logic 620 and provides a first feedback path 660 (as in FIG. 3) as well as providing the 6-bit signal to the second adder logic 655. The output from the second adder logic 655 is applied as a second feedback path 665.

Referring now to FIG. 7, a hardware implementation of an additional circuit 700 to provide reset recovery is illustrated, in accordance with embodiments of the present invention. The additional circuit 700 comprises a MIN node 710 that provides a result of a NOR operation applied on the '10' debubbler output lines (of FIG. 6). A MAX node 705 is simply connected to the last of the '10' debubbler output lines. A clock input 715 is provided to clock shift registers 720, 725 and D-type flip-flop 725. The MIN node 710, MAX node 705 and shift registers 720, 725 are operably coupled to a series of NAND logic gates 745, whose outputs are input to a further NAND gate 750. The further NAND logic gate provides a first input to a NOR logic gate 735 and a D-Type flip-flop 725.

Notably, the circuit in FIG. 7 is used to provide a stable, guaranteed start-up condition and/or provide a reliable recovery process should the analog input signal (or any associated circuit) do anything unexpected. Thus, during normal operation of the delta-sigma modulator, the reset circuit of FIG. 7 is unused.

The reset recovery circuit 700 detects whether one of four events, which may be experienced by the ADC occurs, namely:
 (i) When the output goes between threshold levels, in either one or two clock-cycles;
 (ii) When the output remains stuck at a threshold level for at least four clock-cycles.

These events are identified as instability symptoms and will generate a reset signal to recover the modulator.

In operation, each time any of the above events are detected, a two-clock-cycle reset signal is generated. The D-type flip-flop 725 forces the reset signal 730 to last two clock cycles. The reset signal 730 is then arranged to reset both the analog and digital integrators of FIG. 3. In this regard, the reset signal places the modulator in a midrange condition. Simulations have shown that when the modulator input signal is close to the midrange condition, normal operation starts without trigging the recovery circuit.

Although the preferred embodiment of the present invention has been described with reference to an auto-ranging logic for a multi-bit delta-sigma ADC, it is envisaged that the inventive concept may be applied to any circuit to widen its voltage swing by dynamically shifting both the input and the output of the ADC.

It will be understood that the improved wireless communication unit, an integrated circuit comprising a delta-sigma modulator, and a method of operation therefor, as described above, aims to provide at least one or more of the following advantages:

(i) The application of auto-ranging logic with a self-recovery technique supports a reduction of the number of comparators required in a multi-bit quantizer of a $2^{nd}$ order delta-sigma ADC.

(ii) The application of auto-ranging logic with a self-recovery technique supports a reduction in power consumption and die size. The saving is significant, and in some embodiments may be of the order of:

(a) Die size of quantizer by 50-70%;
(b) Die size of the whole delta-sigma modulator by 10-15%;
(c) Power consumption of whole delta-sigma modulator by 10-20%.

In particular, it is envisaged that the aforementioned inventive concept can be applied by a semiconductor manufacturer to any delta-sigma ADC integrated circuit (IC). It is further envisaged that, for example, a semiconductor manufacturer may employ the inventive concept in a design of a stand-alone device, such as a multi-bit delta-sigma ADC IC, or application-specific integrated circuit (ASIC) and/or any other sub-system element.

It will be appreciated that any suitable distribution of functionality between different functional units or delta-sigma ADC components or logic elements, may be used without detracting from the inventive concept herein described. Hence, references to specific functional devices or elements are only to be seen as references to suitable means for providing the described functionality, rather than indicative of a strict logical or physical structure or organization.

Aspects of the invention may be implemented in any suitable form including hardware, software, firmware or any combination of these. The elements and components of an embodiment of the invention may be physically, functionally and logically implemented in any suitable way. Indeed, the functionality may be implemented in a single unit or IC, in a plurality of units or ICs or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to "a", "an", "first", "second" etc. do not preclude a plurality.

Thus, an improved electronic device, such as a wireless communication unit, an integrated circuit comprising a delta-sigma modulator, and a method of operation therefor have been described, wherein the aforementioned disadvantages with prior art arrangements have been substantially alleviated.

The invention claimed is:

1. An integrated circuit comprises:
a delta-sigma modulator incorporating a delta-sigma modulation loop having an analog-to-digital converter in a forward path and a digital-to-analog converter in a feedback path such that the ADC is arranged to receive samples of an analog input signal;
wherein:
the ADC is operably coupled to auto-ranging logic arranged to shift a digital output signal from the ADC representative of the analog input signal to counteract an effect of an input variation of the analog input signal, wherein the auto-ranging logic correspondingly shifts the analog input signal to the ADC via the feedback path; and
the auto ranging logic comprises decision logic arranged to determine a variation of the analog input signal to the ADC and perform a corresponding shift of the analog signal input to the ADC via the feedback path to counteract an effect of the variation.

2. The integrated circuit of claim 1 wherein the auto-ranging logic is arranged to shift the analog input signal and/or the digital output signal to a mid-range of operation of the ADC.

3. The integrated circuit of claim 1 wherein the auto ranging logic comprises a digital integrator operably coupled to the decision logic, wherein the decision logic is arranged to determine a variation in the digital output signal from the ADC corresponding to the variation of the analog input signal and provide a pulse signal to the digital integrator in response thereto.

4. The integrated circuit of claim 3 wherein the integrated pulse signal output from the digital integrator is combined with the analog input signal to the ADC and integrated by an analog integrator to shift the analog input signal to the ADC.

5. The integrated circuit of claim 3, wherein the decision logic determines a variation of the digital output signal from the ADC from a mid-range position of the from the ADC.

6. The integrated circuit of claim 1, wherein the auto ranging logic is operably coupled to a reset recovery circuit arranged to reset one or more components in the delta-sigma modulator in response to determining that the analog input signal has traversed outside of a threshold.

7. The integrated circuit of claim 6 wherein the delta-sigma modulator includes a plurality of analog integrators in the forward path of the delta-sigma modulation loop wherein at least one integrator of the plurality of analog integrators is reset in response to determining that the analog input signal has traversed outside of an upper threshold or a lower threshold.

8. The integrated circuit of claim 6 wherein the reset recovery circuit detects whether one or more of the following events has occurred in the ADC:
(i) The digital output signal travels between a lower threshold level and a higher threshold level within one or two clock-cycles; or
(ii) The digital output signal remains at a threshold level for at least four clock-cycles.

9. An electronic device comprising the integrated circuit of claim 1.

10. A method for converting an analog input signal to a digital output signal in a delta-sigma modulator incorporating a delta-sigma modulation loop and an analog to digital converter, the method comprising:
- periodically sampling an analog input signal with a plurality of comparators; and
- converting by the ADC the sampled analog input signal to a digital output signal representative of the analog input signal;
- determining a variation in the analog input signal; and
- shifting the digital output signal from the ADC to counteract an effect of the determined variation of the analog input signal and correspondingly shifting the analog input signal to the ADC via a feedback path.

11. The method of claim 10 further comprising shifting the digital output signal from the ADC and/or shifting the analog input signal to the ADC to a mid-range of operation of the ADC.

12. The method of claim 10 further comprising:
- determining a variation in the digital output signal from the ADC and providing a pulse signal to a digital integrator in response to the determined variation in the digital output signal;
- integrating the pulse signal; and
- combining the integrated pulse signal with the analog input signal to the ADC to shift the analog input signal to the ADC.

13. The method of claim 10, further comprising resetting one or more components in a delta-sigma modulator in response to determining that the analog input signal has traversed outside of a threshold.

14. The method of claim 13 further comprising detecting whether one or more of the following events has occurred in the ADC:
  (i) The digital output signal travels between the lower threshold level and the higher threshold level within one or two clock-cycles; or
  (ii) The digital output signal remains at a threshold level for at least four clock-cycles.

15. An integrated circuit comprising:
- a delta-sigma modulator incorporating a delta-sigma modulation loop having an analog-to-digital converter in a forward path and a digital-to-analog converter in a feedback path such that the ADC the ADC is operably coupled to auto-ranging logic and is arranged to receive samples of an analog input signal;
- wherein the auto-ranging logic is operably coupled to a reset recovery circuit arranged to reset one or more components in the delta-sigma modulator in response to determining that the analog input signal has traversed outside of a threshold.

16. The integrated circuit of claim 15 wherein the delta-sigma modulator further characterized in by further includes a plurality of analog integrators in the forward path of the delta-sigma modulation loop wherein at least one integrator of the plurality of analog integrators is reset in response to determining that the analog input signal has traversed outside of an upper threshold or a lower threshold.

17. The integrated circuit of claim 15 wherein the reset recovery circuit detects whether one or more of the following events has occurred in the ADC:
  (i) The digital output signal travels between a lower threshold level and a higher threshold level within one or two clock-cycles; or
  (ii) The digital output signal remains at a threshold level for at least four clock-cycles.

18. An electronic device comprising the integrated circuit of claim 15.

19. A method for converting an analog input signal to a digital output signal in a delta-sigma modulator incorporating a delta-sigma modulation loop and an analog to digital converter, the method comprising:
- periodically sampling an analog input signal with a plurality of comparators; and
- converting by the ADC the sampled analog input signal to a digital output signal representative of the analog input signal;
- determining a variation in the analog input signal; and
- shifting the digital output signal from the ADC to counteract an effect of the determined variation of the analog input signal;
- resetting one or more components in a delta-sigma modulator in response to determining that the analog input signal has traversed outside of a threshold.

20. The method of claim 19 further comprising detecting whether one or more of the following events has occurred in the ADC:
  (i) The digital output signal travels between the lower threshold level and the higher threshold level within one or two clock-cycles; or
  (ii) The digital output signal remains at a threshold level for at least four clock-cycles.

* * * * *